(12) United States Patent
Xue et al.

(10) Patent No.: US 6,351,357 B1
(45) Date of Patent: *Feb. 26, 2002

(54) LAMINATED HARD MAGNET IN MR SENSOR

(75) Inventors: Song Sheng Xue, Edina; James F. Dolejsi, Chanhassen; Patrick J. Ryan, St. Paul, all of MN (US)

(73) Assignee: Seagate Technology LLC, Scotts Valley, CA (US)

(*) Notice: Subject to any disclaimer, the term of this patent is extended or adjusted under 35 U.S.C. 154(b) by 0 days.

This patent is subject to a terminal disclaimer.

(21) Appl. No.: 09/665,782

(22) Filed: Sep. 20, 2000

Related U.S. Application Data

(63) Continuation of application No. 09/000,536, filed on Dec. 30, 1997, now Pat. No. 6,144,534.
(60) Provisional application No. 60/041,396, filed on Mar. 18, 1997.

(51) Int. Cl.[7] .................................................. G11B 5/39
(52) U.S. Cl. .................................................. 360/327.31
(58) Field of Search .................................... 360/327.31

(56) References Cited

U.S. PATENT DOCUMENTS

| | | | |
|---|---|---|---|
| 4,596,646 A | * 6/1986 | Kitada et al. | 204/192.15 |
| 4,743,988 A | 5/1988 | Sato et al. | 360/126 |
| 5,290,629 A | 3/1994 | Kobayashi et al. | 428/332 |
| 5,327,638 A | 7/1994 | Haines et al. | 360/119 X |
| 5,434,826 A | 7/1995 | Ravipati et al. | 367/140 |
| 5,608,593 A | 3/1997 | Kim et al. | 360/113 |
| 5,657,190 A | 8/1997 | Araki et al. | 360/113 |
| 5,696,654 A | 12/1997 | Gill et al. | 360/113 |
| 5,739,987 A | 4/1998 | Yuan et al. | 360/113 |
| 5,742,459 A | 4/1998 | Shen et al. | 360/113 |
| 5,790,351 A | 8/1998 | Suzuki | 360/113 |
| 5,995,338 A | 11/1999 | Watanabe et al. | 360/113 |
| 6,144,534 A | * 11/2000 | Xue et al. | 360/327.31 |

FOREIGN PATENT DOCUMENTS

| | | | |
|---|---|---|---|
| JP | 61-194635 | * | 8/1996 |
| JP | 8-235538 | | 9/1996 |
| JP | 9-282612 | | 10/1997 |

* cited by examiner

*Primary Examiner*—William Klimowicz
(74) *Attorney, Agent, or Firm*—Kinney & Lange, P.A.

(57) ABSTRACT

A magneto-resistive sensor has a magneto-resistive element with an active area with an electrical resistance sensitive to changes in magnetic flux. Two hard magnets on opposing sides of the magneto-resistive element magnetically bias the magneto-resistive element. Each hard magnet includes a seed layer of a soft magnetic, electrically conductive material between two magnet layers of a hard magnetic, electrically conductive material laminated longitudinally together such that the seed layer and the magnet layers exhibit unified magnetic properties. The seed layer is preferably an amorphous material such as nitrided sendust. The laminated structure allows for a thicker magnet structure with low electrical resistance but without degradation of magnetic properties due to the increased thickness.

14 Claims, 12 Drawing Sheets

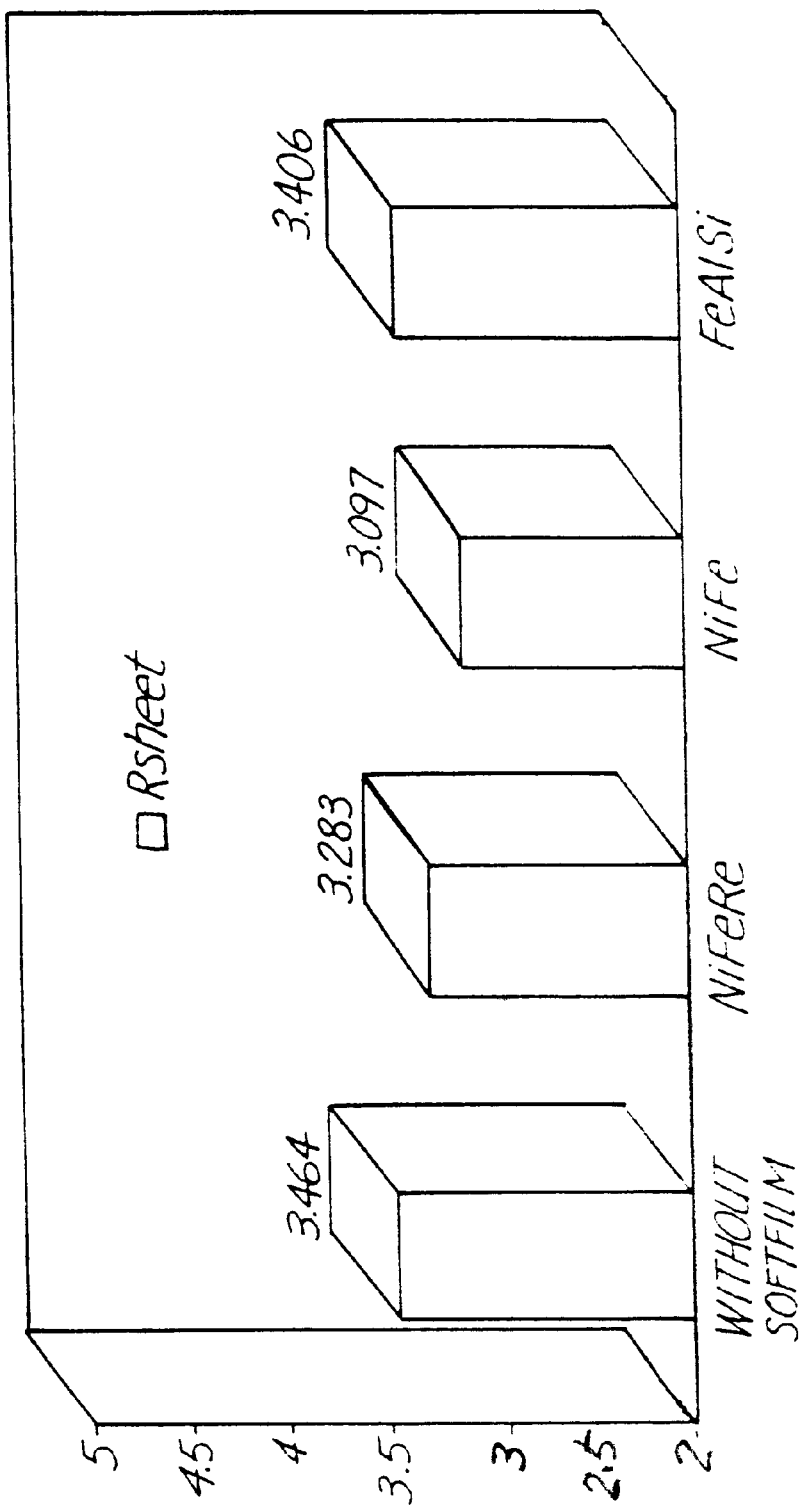

LAMINATED HARD MAGNET IN MR SENSOR

This application is a continuation of application Ser. No. 09/000,536 filed Dec. 30, 1997, now issued as U.S. Pat. No. 6,144,534, which claims the benefit of provisional application No. 60/041,396 filed on Mar. 18, 1997, entitled "Soft Sendust Laminated CoPt Film as a Hard Bias Film".

BACKGROUND OF THE INVENTION

The present invention pertains to the design or a permanent or "hard" magnet in a magneto-resistive sensor. More particularly, the present invention pertains to a hard magnet which has increased height or thickness and the resultant decrease in resistance and increased magnetic strength while maintaining the directional attributes of a thinner hard magnet structure. The objective of the invention is to optimize the design and performance of the magneto-resistive (MR) sensor.

MR sensors or heads are used to read magnetically encoded information from a magnetic medium by detecting magnetic signal stored in the magnetic medium or, more precisely, by detecting changes in magnetic flux while moving immediately above the magnetic medium. The MR sensor has an "active area" which includes a layer or strip of magneto-resistive material, i.e. a material with an electrical resistance which varies responsive to changes in magnetic flux. During the operation of an MR sensor, a sense current is passed through the active area, with the resistance of the active area causing a voltage drop. The magnitude of the voltage drop is at least partially a function of the resistant of the MR layer in the active area.

The MR sensor is suspended immediately adjacent a magnetic medium while the magnetic medium moves relative to the MR sensor. The magnetic medium has magnetic "transitions", i.e., changes in direction of magnetic alignment, which were previously recorded by the write head. As he direction and magnitude of the magnetic flux running through the MR sensor varies, the voltage drop across the active area also vanes. The magnetic transitions are accordingly detected by monitoring the voltage across the active area of the MR element.

The change of resistance across the MR element per change in magnetic flux has been found to depend upon the square of the cosine of the angular relationship between the direction of magnetization (magnetization vector M) of the MR element and the direction of electrical current (current density vector J) flowing through the MR element. An MR sensor will provide its most linear output, that is, approximately equal and opposite changes in output for corresponding equal and opposite changes in magnetic flux, when these two vectors form an angle of 45°. A generally linear output from the MR sensor is necessary to achieve optimum sensitivity and minimum readback signal distortion, to provide a signal which can be easily and accurately read.

Permalloy is an alloy of nickel and iron which is typically used as an MR material. When permalloy is formed into a long narrow strip such as commonly used in the active region of a MR sensor, it naturally tends to form a magnetization vector along its long axis. This alignment can be enhanced by a field induced anisotropy formed during the deposition of the permalloy element. The current density vector is also naturally orientated along the long axis of the MR element, in the same direction as the natural alignment of the magnetization vector, leading to an angle between these two vectors approaching 0°.

Various techniques have been used to increase the angle between the magnetization vector and the current density vector to more nearly approach 45°. For instance, a soft adjacent layer (SAL) may be used adjacent the MR element. In conjunction with the SAL or otherwise, permanent or hard magnets may be placed adjacent the MR element.

The hard magnets are commonly formed of a Cobalt based alloy with a sufficiently high coercivity, which is sufficiently magnetized and perhaps shielded so the magnetic fields of the media and/or the write head do not effect the magnetism of the hard magnets. That is, the hard magnets once constructed should be permanently magnetized in the field of use. To perform effectively, the hard magnets should have a high coercivity, high MrT and have high in-plane squareness on the magnetization curve.

Located adjacent the MR element, the hard magnet structure not only affects the magnetism in the active area of the MR layer, but also is within the flow path of current to and from the active area of the MR layer. As in the MR layer, both the magnetic and the electrical properties of the hard magnet structure are important to maximize signal readability. The magnetic field of the hard magnets should be large enough to keep the active area of the MR layer in a single domain state to suppress the "Barkhausen" noise, yet small enough so as not to reduce the sensitivity of the MR sensor to magnetic flux changes.

MR elements can "fracture" into multiple magnetic domains when they are exposed to an external magnetic field, creating so called "Barkhausen noise" in the resulting output from the MR sensor. To maximize the MR sensor's output stability, it is desirable to maintain the MR element in a single domain state. The structure of the hard magnets play a vital role in stabilization of the MR element in a single domain state.

BRIEF SUMMARY OF THE INVENTION

The present invention is a hard magnet structure such as used to magnetically bias an active area of an MR sensor, and an MR sensor incorporating the hard magnet structure. Each hard magnet includes at least one seed layer of a soft magnetic, electrically conductive material and at least one magnet layer of a hard magnetic, electrically conductive material laminated together such that the seed layer and the magnet layer exhibit unified magnetic properties. The preferred structure includes multiple magnet layers separated by seed layers of amorphous nitrided sendust, which together form a relatively thick hard magnet. The relatively thick hard magnet has low electrical resistance but provides strong magnetic properties including high in-plane squareness, The seed layers are believed to disconnect or break the tendency of the magnet layers to establish out-of-plane growth with increasing thickness, while still allowing the magnetic fields of each of the magnet layers to be additive toward creating an overall field strength.

BRIEF DESCRIPTION OF THE DRAWINGS

FIG. 14 is a chart of measured electrical sheet resistance of the structures of FIGS. 8–11.

DETAILED DESCRIPTION OF THE PREFERRED EMBODIMENTS

Figure 1:
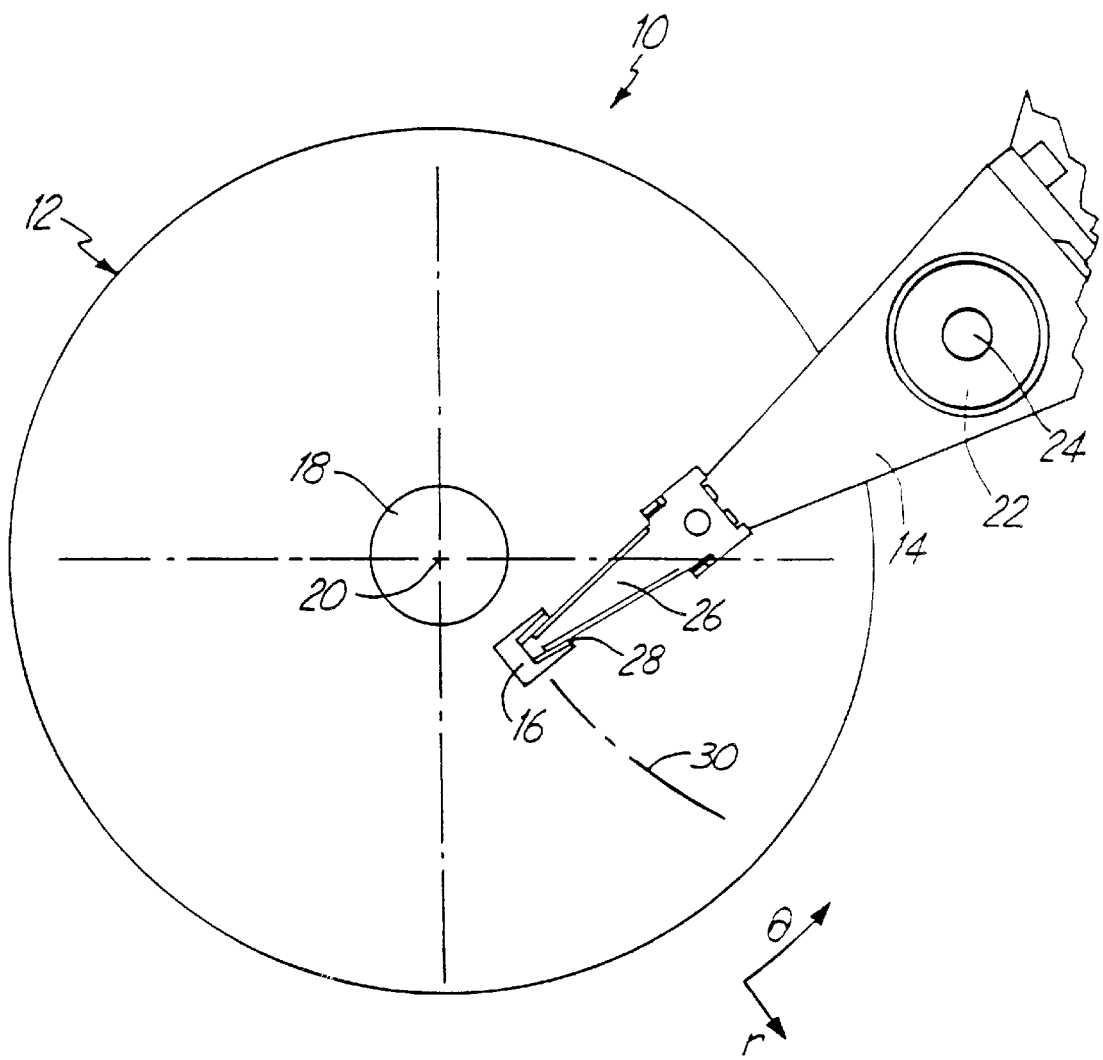
FIG. 1 is a top view of a disc drive.

The present invention is particularly contemplated for use in a disc drive 10 exemplified in FIG. 1. The disc drive assembly 10 includes at least one disc 12 and an actuator arm 14 with a slider or magnetic head assembly 16. The disc is mounted on a drive spindle 18, and during use of the disc drive assembly 10, the drive spindle 18 rotates the disc 12 about axis 20. The actuator arm 14 is mounted on a servo spindle 22 and is pivotable about axis 24 by a servo motor (not shown). The actuator arm 14 extends parallel to the plane of the disc 12 and carries at least one flexure or suspension arm 26. The suspension arm 26 supports the air bearing slider 16 adjacent a surface of the disc 12. As disc 12 rotates about drive spindle 18, the aerodynamic properties of the slider 15 cause it to "fly" above the surface of disc 12. The MR sensor 28 of the present invention is generally fabricated on the trailing edge of the slider 16, for positioning as close as possible to the rotating disc 12. Pivoting of actuator arm 14 moves the magnetic head assembly 16 through arc 30, and allows the magnetic head assembly 16 to change track positions on its disc 12.

The disc drive 10 shown is only one example of a structure in which the present invention is useful. The MR sensor of the present invention could alternatively be used in other disc drive structures, in magnetic recording on other media such as tape, or on other, completely unrelated applications. For instance, MR sensors may be used in anti-lock braking systems to sense rotation of the wheel of a vehicle.

Figure 2:
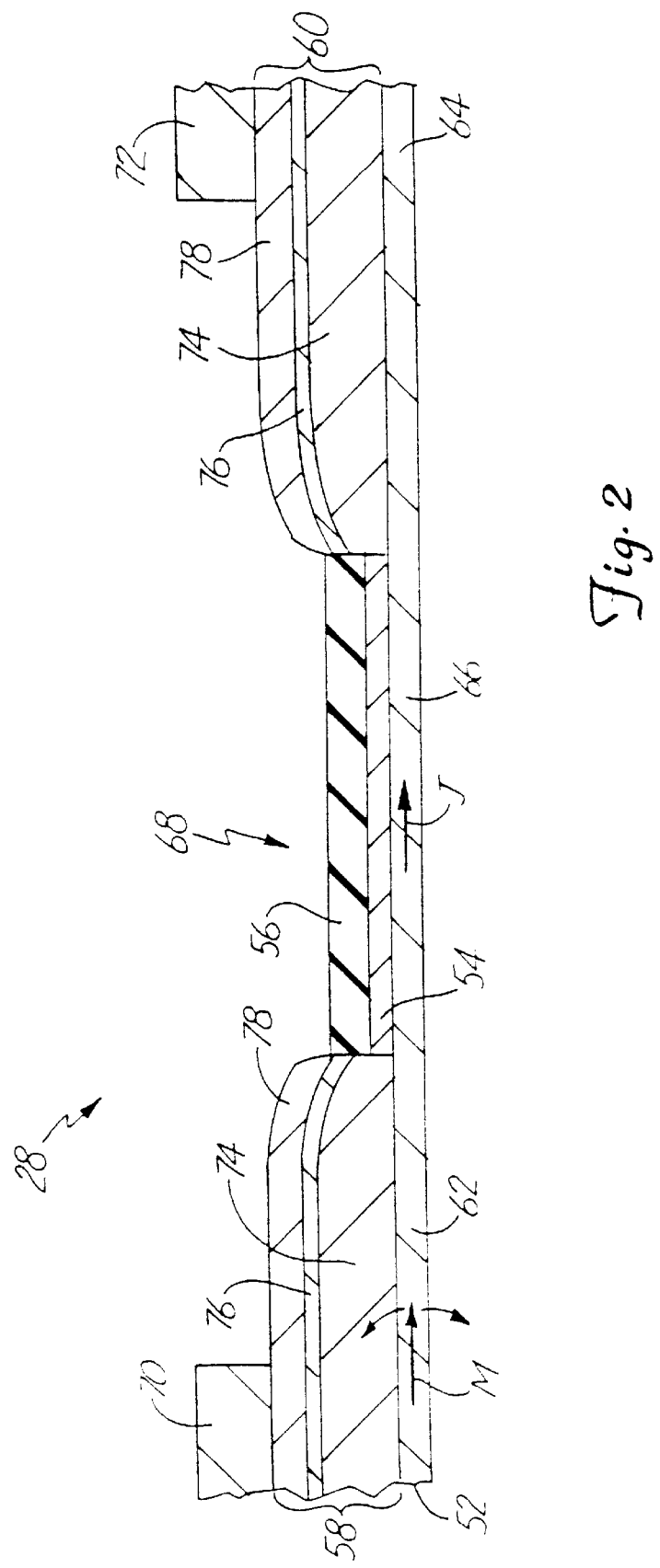
FIG. 2 is a sectional view of the MR sensor of the present invention.

FIG. 2 is a sectional view of the MR sensor 28 incorporating the present invention. The sectional view shown in FIG. 1 is taken from a plane parallel to the air bearing surface of the magnetic head assembly 16. In other words, the air bearing surface of MR sensor 28 and the plane of the disc 12 are parallel to the plane of the page. MR sensor 28 includes an MR layer or element 52, a spacer layer 54, a soft adjacent layer (SAL) 56, a first hard magnet 58 and a second hard magnet 60.

Many additional layers (not shown in FIG. 2) are typically also present in the magnetic head assembly, though only the layers which contribute to the MR sensor 28 are discussed herein. For instance, the MR sensor 28 is typically fabricated on a substrate (not shown) with layers of a write transducer (not shown) situated next to the MR sensor 28 and separated from the MR sensor 28 by at least one shield layer (not shown). The MR sensor 28 may be fabricated either with the MR layer 52 deposited first or with the MR layer 52 deposited last, and the top to bottom orientation of FIG. 2 is not significant to the present invention.

The MR element 52 includes a first outer region 62 in contact with the first hard magnet 58, a second outer region 64 in contact with the second hard magnet 60, and an "active area" 66 which is between outer regions 62 and 64. The spacer layer 54 is positioned between the hard magnet 58 and 60 and on top of the active area 66 of the MR element 52. The SAL 56 is positioned on top of the spacer layer 54 such that the SAL 56 is also at least partially located between the hard magnets 58 and 60. An active region 68 of MR sensor 50 includes the active area 66 of the MR element 52, the spacer layer 54, and at least portions of the SAL 56.

Hard magnets 58 and 60 act as boundaries to define an edge of active region 68. The first outer region 62 of the MR element 52 is hard biased, exchange coupled or otherwise inhibited from responding to the changes in magnetic flux from the media due to its close proximity to the first hard magnet 58. The second outer region 64 of the MR element 52 is similarly held from responding due to its close proximity to the second hard magnet 60. There is no hard magnet immediately adjacent the active area 66 of the MR element 52, therefore, the active region 66 responds to changes in magnetic flux with changing electrical resistance. Hard magnets 58 and 60 thus help to provide a well-defined reader track width to active area 66.

The present invention is applicable to the construction of MR sensors which use hard magnets regardless of the location of the hard magnets. U.S. Pat. Nos. 5,381,291, 5,495,378, 5,554,265, 5,712,565 and 5,776,537 disclose other designs of MR sensors which use hard magnet stabilization, and all assigned to the assignee of the present invention and are all incorporated her by reference. The present invention is particularly applicable to the construction of MR sensors where the hard magnets are in the current flow path between the leads to the active area of the MR element. The magnetic field of the hard magnets 58 and 60 should be large enough to ensure a single-domain configuration in the active area 66, yet small enough so as not to change the linearity and signal amplitude of the resultant MR signal.

The MR element 52 is, in preferred embodiments, a layer of permalloy. Permalloy is a name commonly used to identify any of a large number of highly magnetically permeable alloys containing a combination of nickel Ni and iron Fe. It must be noted that other magneto-resistive materials can be used instead of permalloy. In preferred embodiments, the resistivity of the MR element 52 is between 20 and 35 $\mu\Omega$-cm. The MR element 52 preferably has a thickness of between 150 and 500 Angstroms (Å).

The spacer layer 54 is a non-magnetic layer of high resistivity material which is positioned between the SAL 56 and the active region 66 to prevent magnetic exchange coupling between these two layers. The resistivity of the spacer layer 54 is preferably substantially higher than that of the MR element 52 so that it does not shunt current away from the active area 66 of the MR element 52. In preferred embodiments, spacer layer 54 is a layer of tantalum Ta having a resistivity of at least 200 $\mu\Omega$-cm and a thickness of between 50 and 200 Å.

The SAL 56 is preferably a layer of ferromagnetic material such as nickel-iron-rhodium NiFeRh, nickel-ironrhenium NiFeRe, nickel-iron-chromium NiFeCr, Nickel-Iron-Niobium NiFeNb, Cobalt-Niobium CoNb, Cobalt-Niobium-Zirconium CoNbZr, Cobalt-Hafnium-Tantalum CoHfTa, etc. The resistivity of SAL 56 is preferably at least 100 $\mu\Omega$-cm to reduce the shunting of current away from the active area 66 of the MR element 52. SAL 56 has a preferred thickness of between 100 and 400 Å.

Electrical current is provided to the MR sensor 28 between a first lead 70 and a second lead 72. The first lead 70 and the second lead 72 connect the MR sensor 28 to bond pads and external circuitry (not shown) which provides the current source and manipulates the resultant electrical signal into a binary response. The first and second lead 70, 72 are highly conductive and are typically between 1000 Å and 3000 Å thick.

For purposes of explanation, it will be assumed that current flows from the first lead 70 to the second lead 72, from left to right in the plane of the page. The current does not travel entirely through a defined flow path from the first lead 70 to the second lead 72, but rather flows through all the intervening structure at different rates. Because of the relatively high resistivity of the spacer layer 54 and the SAL 56, most of the current flows through the active area 66 of the MR element 52 with a current density vector in a consistent x-direction (from left to right in the plane of the page). In the side wings areas of the MR sensor 28, including the first hard magnet 58, the first outer region 62, the second hard magnet 60 and the second outer region 64, the current density vector also has a significant y-component to traverse from the first lead 70 to the active area 66 and back up to the second lead 72. It is desired that the electrical resistance in these side wings areas be minimized, so as much resistance as possible is due to the resistance of the active area 66 of the MR element 52.

For minimal electrical resistance, it is desired to have relatively thick hard magnets 58, 60. However, for most traditional materials for bard magnets, magnetic characteristics such as squareness degrade as the film thickness increases, and the degradation becomes considerable if the hard magnets are more than about 600 Å thick, and very substantial if the hard magnets are more than about 1000 Å thick.

Figure 3:
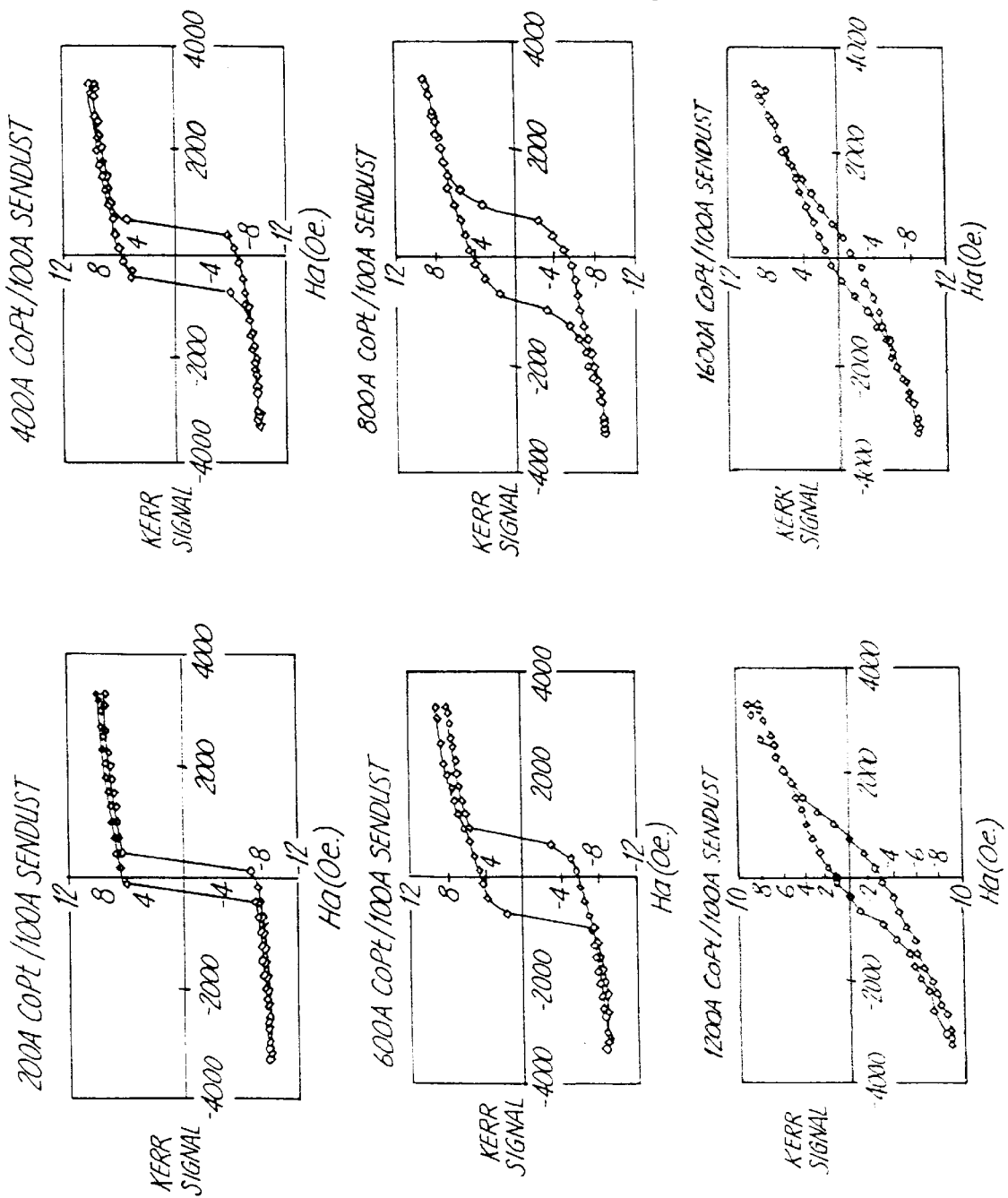
FIG. 3 is magnetization curves for various thicknesses of single layer hard magnets.
Figure 4:
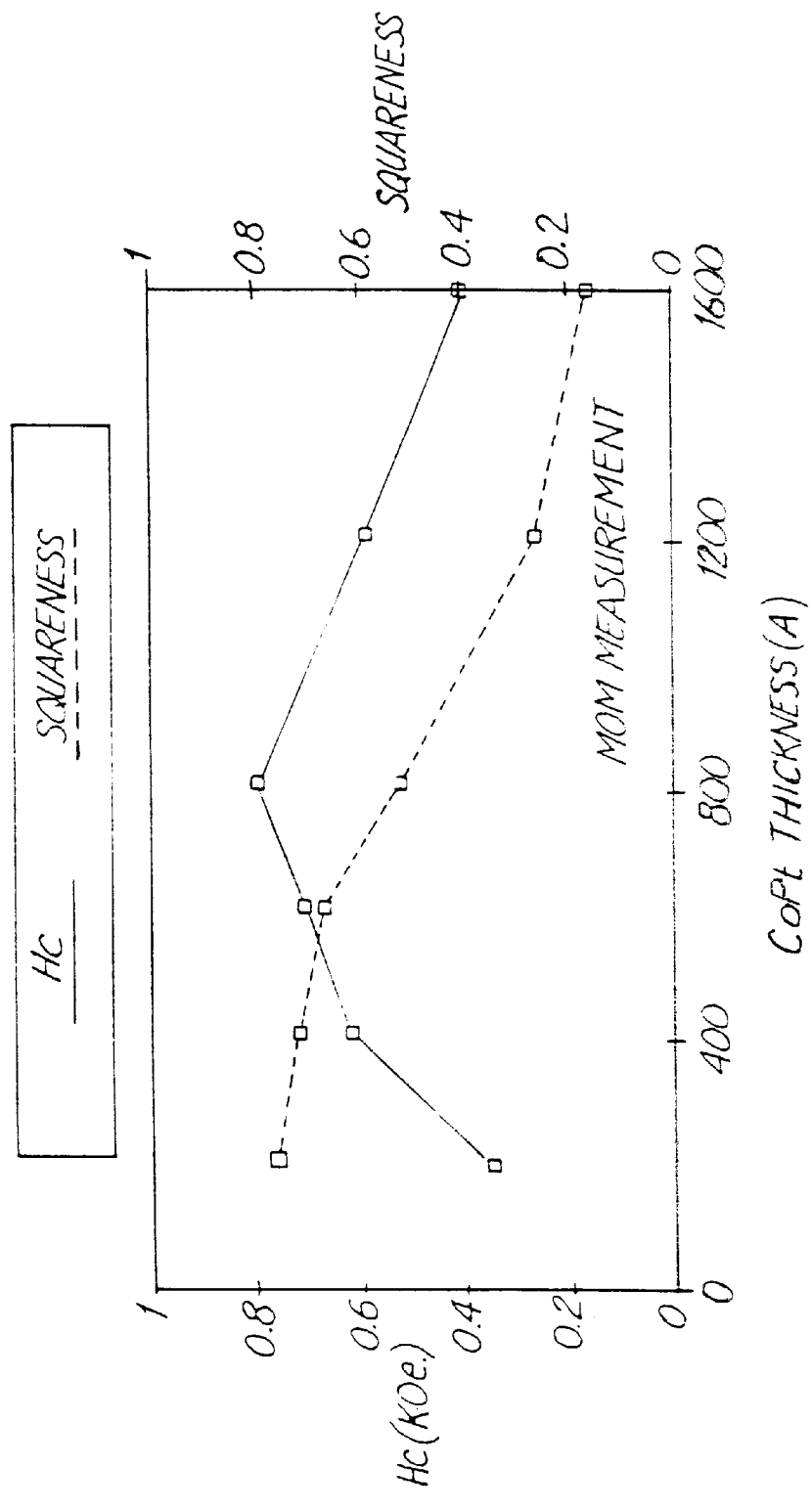
FIG. 4 is a graph of single layer hard magnet thickness vs. squareness and coercivity.
Figure 5:
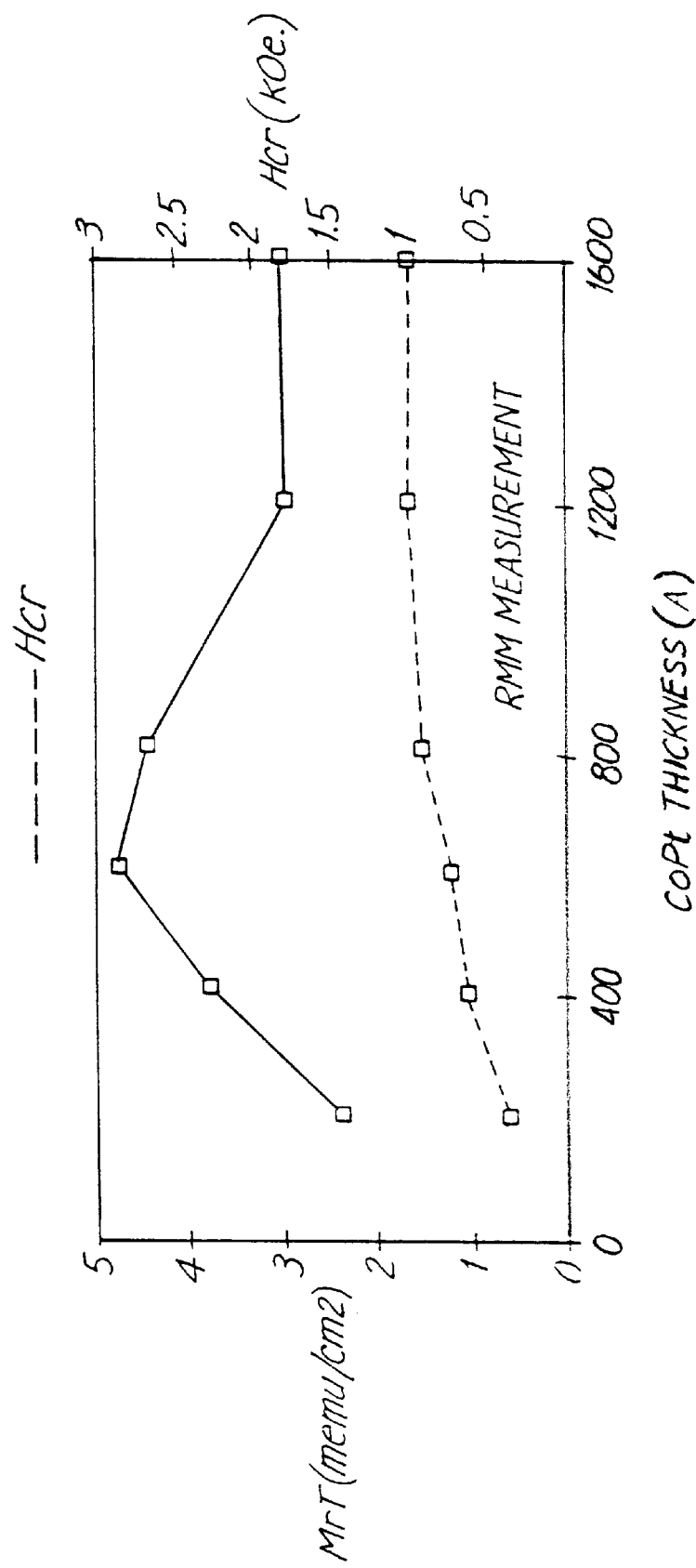
FIG. 5 is a graph of single layer hard magnet thickness vs. $M_rT$ and remanence coercivity.

This "degradation with increasing thickness" phenomenon is illustrated in FIGS. 3–5. FIG. 3 shows tested magnetization curves of 200 Å, 400 Å, 600 Å, 800 Å, 1200 Å and 1600 Å thicknesses of r magnets. Each of the hard magnet test structures were fabricated on a 4.5 inch substrate wafer (AlTiC) and with a 100 Å underlayer of sendust (FeAlSi). Cobalt-Platinum CoPt was selected as the hard magnet material. The 1200 Å structure is further shown and described below with reference to FIG. 8, and except for the thickness of the hard magnets, all the structures were identically constructed. The magnetization or hysteresis curve was determined for the hard magnet test structures by varying the strength of the applied magnetic field and measuring the resultant magnetism of the test structure with a Magneto-Optic Kerr Effect Magnetometer (MOM).

FIG. 4 further compares the results shown in FIG, 3 as a function of hard magnet thickness. As shown, the tested coercivity Hc (i.e., strength of applied magnetic field required to reverse the resultant magnetization of the tested sample to zero) is highest at hard magnet thicknesses of 600 Å and 800 Å. The tested squareness (i.e., the magnetization of the tested sample at saturation Ms divided by the remanent magnetization of the tested sample when the applied magnetic field is reduced to zero Mr) has values above 0.6 for hard magnet thickness of 600 Å or less, decreasing to near 0.2 for 1200 Å hard magnet thickness.

FIG. 5 shows results of testing on the same samples with a remanent moment magnetometer (RMM). MrT values tested highest at hard magnet thicknesses of 600 Å and 800 Å. Remanence coercivities Her are approximately equal for all thicknesses over 800 Å, but remanence coercivity is generally the least important of the variables tested for hard magnet biasing of an MR element. An ideal hard magnet will have a squareness approaching 1, high coercivity Hc and high MrT.

The degradation of squareness with increasing hard magnet thickness is believed to be due to gradual growth of the magnetic C-axis in a perpendicular direction as the film thickness increases. Because of this phenomenon, there has previously been a trade-off between thickness of the hard magnets 58, 60 as it contributes to the desired electrical properties of the hard magnets and the desired magnetic properties of the hard magnets.

Referring back to FIG. 2, MR element 52 will naturally tend to form magnetization vector M along its long axis when it is formed. For purposes of explanation, it will be assumed that natural magnetization vector M of active area 66 points in an x-direction from left to right in the plane of the page. Thus, the natural magnetization vector M points in the same direction as the current density vector J in active region 66.

The resistance of the MR element 52 will vary nearly linearly with the magnitude of magnetic flux entering the MR element 52 when magnetization vector M and current density vector J form an angle of approximately 45 degrees. Thus, to achieve a nearly linear response from the MR sensor 28, the natural magnetization vector M of MR element 52 needs to be rotated with respect to the direction of current density vector J. The rotation is achieved in part by the SAL 56 above the active region 66. The magnetic field of SAL 56 causes natural magnetization vector M of MR element 52 to be rotated approximately 45 degrees with respect to the direction of current density vector J.

The preferred hard magnets 58, 60 include a first magnet layer 74, a first intermediate seed layer 76 and a second magnet layer 78. Each of the layers 74, 76 and 78 are longitudinally aligned or parallel with the MR element 52. First and second magnet layers 74, 78 are formed of a magnetic, electrically conductive material, preferably having a defined crystalline structure. The preferred materials for first and second magnet layers 74, 78 are high coercivity cobalt based alloys such as Cobalt-Platinum CoPt, Cobalt-Chromium-Platinum CoCrPt, Cobalt-Chromium-Tantalum CoCrTa, Cobalt-Chromium-Platinum-Tantalum CoCrPtTa or Cobalt-Nickel-Chromium CoNiCr, with Cobalt-Platinum CoPt being the most preferred material. However, it is believed that other ferromagnetic materials can be used instead of these Cobalt based alloys, particularly if the material has its magnetism based on a defined crystalline structure. The resistivity of first and second magnet layers 74, 78 is preferably between 30 and 60 $\mu\Omega$-cm. In preferred embodiments, the thickness of both the first and second magnet layers 74, 78 is between about 200 and 1000 Å, with the most preferred thickness being between about 300 and 800 Å.

The first intermediate seed layer 76 is formed of a soft magnetic, electrically conductive material different from the magnet layers. The preferred first intermediate seed layer 76 is formed of a material with an amorphous structure, such as Cobalt-Zirconium-Tantalum CoZrTa, Cobalt-Zirconium- Niobium CoZrNb, or Cobalt-Zirconium-Hafnium CoZrHf, or amorphous soft sendust FeAlSi, with soft nitrided sendust being the most preferred material. Other soft magnetic materials may also be useful for the first intermediate seed layer 76 instead of those listed, particularly if the material has its magnetism based on an amorphous structure, that is, without a defined crystalline structure. For instance, Nickel-Iron NiFe and Nickel-Iron-Rhenium NiFeRe have also been tried with less beneficial results believed to be due to the defined crystal structure.

The layers 74, 76, 78 laminate together to exhibit unified magnetic and electrical properties, and particularly the magnetic properties exceed those of the same total thickness of the magnet material without the intervening first intermediate seed layer 76. From a microstructural point of view, it is believed that the first intermediate seed layer 76 disconnects the coherent crystal growth of the c-axis of the magnet layer 74 toward perpendicular. The seed layer 76 does not generally add to the magnetic strength of the magnet layers 74, 78, but rather, due to its soft magnetism, allows the entire structure to exhibit unified magnetic properties.

Figure 6:
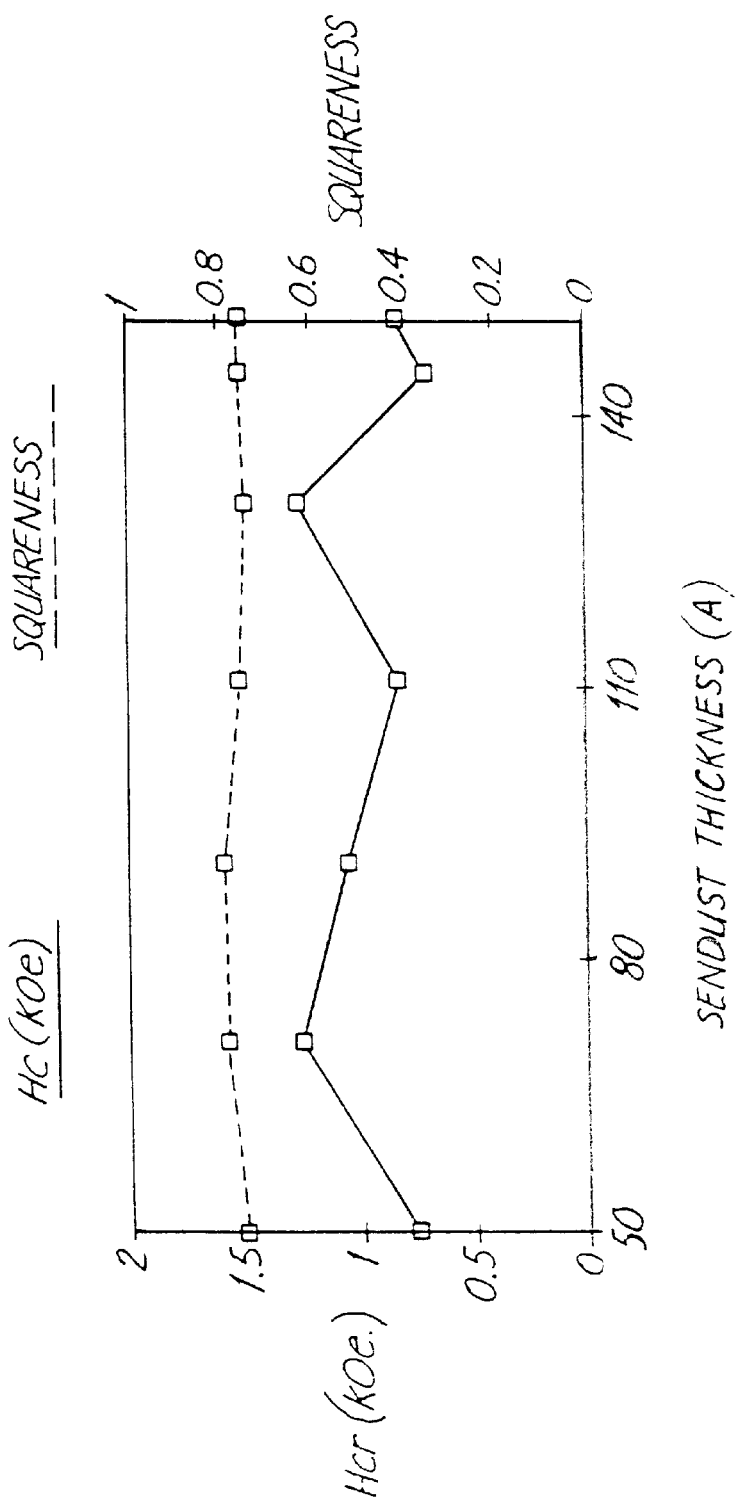
FIG. 6 is a graph of seed layer thickness vs. squareness and coercivity.
Figure 7:
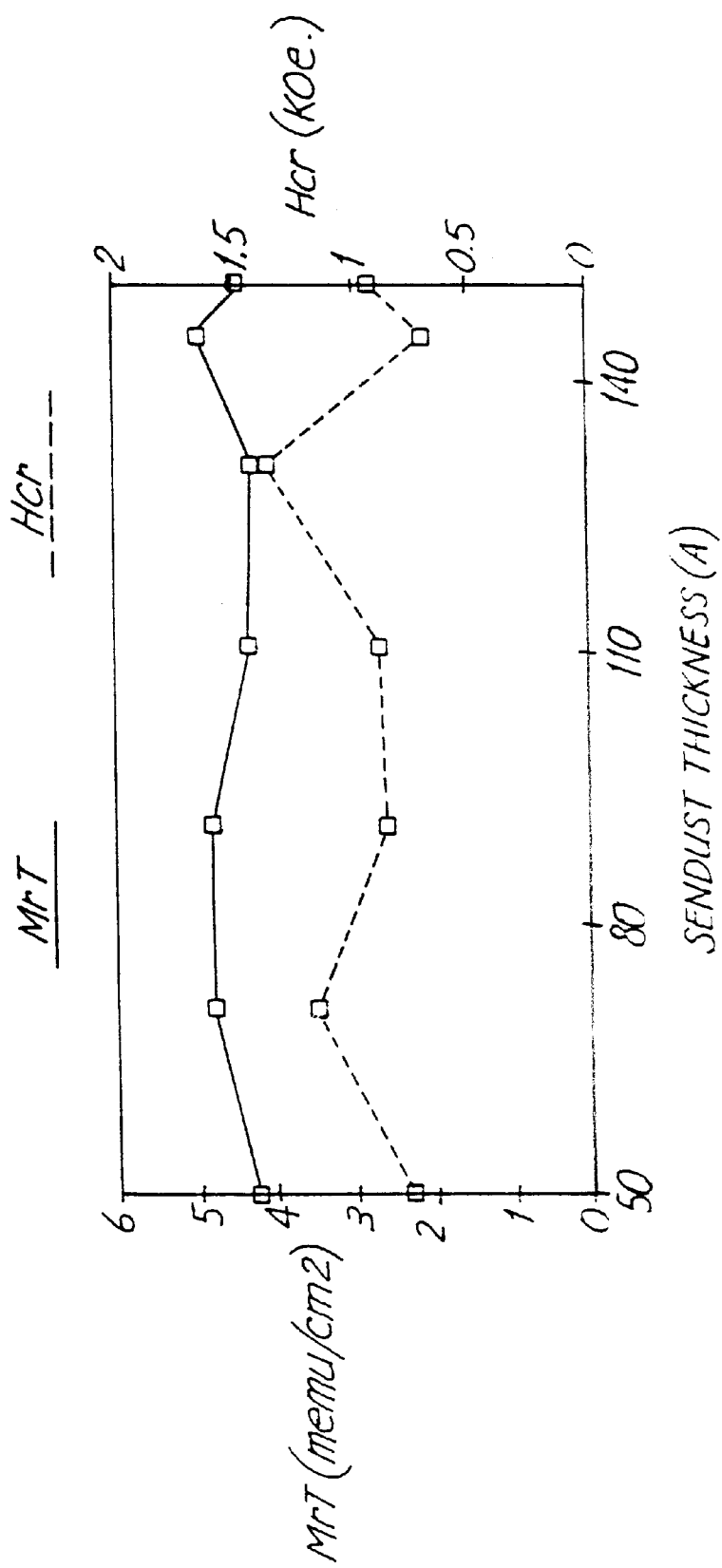
FIG. 7 is a graph of seed layer thickness vs. $M_rT$ and remanence coercivity.

The seed layer 76 should generally be as thin as possible while performing its function of disconnecting the magnet layer coherent crystal growth. In the preferred embodiments the thickness of the first intermediate seed layer 76 is between 50 and 300 Å, with the most preferred thickness being about 50 to 150 Å. FIGS. 6 and 7 show tested magnetic properties of a 500 Å Cobalt-Platinum magnet layer as a function of seed layer thickness, where the thickness of the seed layer vanes from 50 to 150 Å. The seed layer material was amorphous nitrided sendust FeAlSi. This data shows excellent results in squareness and in MrT regardless of the thickness of the seed layer. The coercivity and remanence coercivity values are also very good for all seed layer thicknesses, and it is not understood why the 70 Å and 130 Å seed layers provided such high coercivity and remanence coercivity values. It is believed that thickness of seed layer 76 less than about 50 Å will show "pinhole" effects where the coherent crystal structure of the first magnet layer 74 may leak through to the second magnet layer 78, or vice versa, and thus thicknesses above about 50 Å are preferred.

As shown in FIG. 2, each first magnet layer 74 may be directly in contact with the respective outer region 62, 64 of the MR element 52. The MR sensor 28 is preferably fabricated using target sputtering deposition, photoresist and/or etching techniques well known in the art. The MR sensor 28 may be fabricated in either direction, that is, either the MR element 52 may be deposited first and the first magnet layers 74 deposited onto the respective outer regions 62, 64, or the hard magnets 58, 60 may be deposited first and the MR element 52 deposited onto the first magnet layers 74.

Contact between each of the layers 74, 76, 78 should be intimately established so as to provide a minimal electrical resistance at the interface, as should contact between the hard magnets 58, 60 and the respective leads 70, 72 and contact between the hard magnets 58, 60 and the respective outer regions 62, 64. Minimizing the electrical resistance of the flow path to and from the active area 66 of the MR element 52 allows the resistance of the active area 66 to dominate the resultant signal, improving readability and accuracy of the MR sensor 28.

Additional layers (not shown) may also be used as part of the hard magnet structure. For instance, an underlayer (not shown) may be deposited between the first magnet layers 74 and the respective first outer regions 62, 64, or on the outside of the second magnet layers 78. The underlayer material should be selected to provide a good seed layer for crystal growth above it, but need not necessarily be formed of a magnetic material. For instance, the underlayer may be formed of chromium. Alternatively, the underlayer maybe formed of the same soft magnetic material as the first intermediate seed layer 76. Forming the underlayer of a soft magnetic material is preferred if the underlayer will be in contact with the MR element 52, as intimate magnetic transfer (both hard biasing and exchange coupling) is desired between the hard magnets 58, 60 and the respective first outer regions 62, 64. Forming the underlayer of a soft magnetic material allows the underlayer to become part of the hard magnet structure and provide unified magnetic properties with the first magnet layer 74, the first intermediate seed layer 76 and the second magnet layer 78.

The laminated hard magnet structure of the present invention is not limited to two magnet layers 74, 78. Instead, hard magnets 58, 60 may be constructed with as many magnet layers as desired, with each magnet layer separated from the adjacent magnet layer by an additional intermediate seed layer. Thus, the hard magnets 58 and 60 can be made as thick as desired either to provide the necessary magnetic properties for proper biasing of the MR element, or to provide additional reduction of electrical resistance. For instance, as shown in FIG. 9A, a third magnetic layer 82 may be separated from the second magnetic layer 78 by seed layer 80.

EXAMPLES

Figure 8:
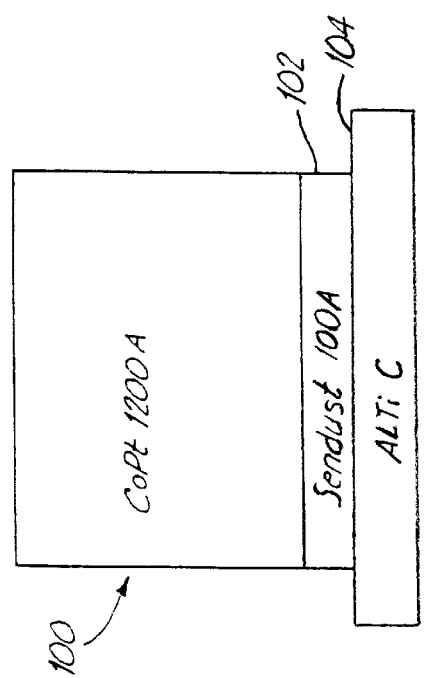
FIG. 8 is a prior art hard magnet structure and corresponding measured magnetization curve.
Figure 8:
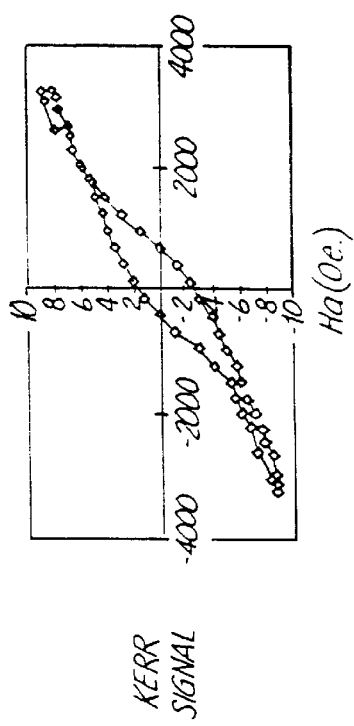

FIG. 8 shows a prior art hard magnet structure 100. A 100 Å thick underlayer 102 of nitrided sendust FeAlSi was formed on a substrate AlTiC wafer 104. A 1200 Å thick hard magnet 104 of CoPt was formed on the underlayer 102. The magnetization or hysteresis curve was determined for the hard magnet structure 100 by varying the strength of the applied magnetic field and measuring the resultant magnetism of the test structure 100 with a Magneto-Optic Kerr Effect Magnetometer (MOM).

Figure 9:
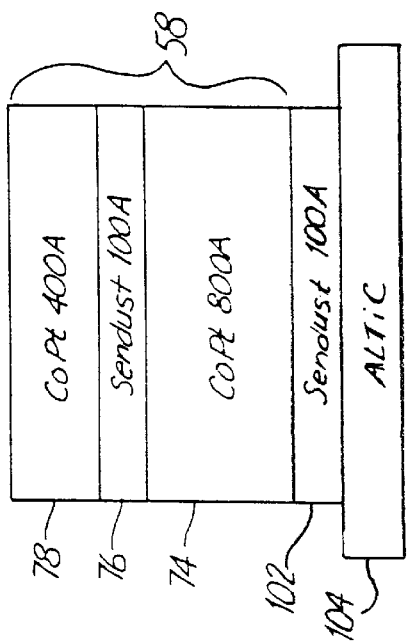
FIG. 9 is a preferred hard magnet structure of the present invention and corresponding measured magnetization curve.
Figure 9:
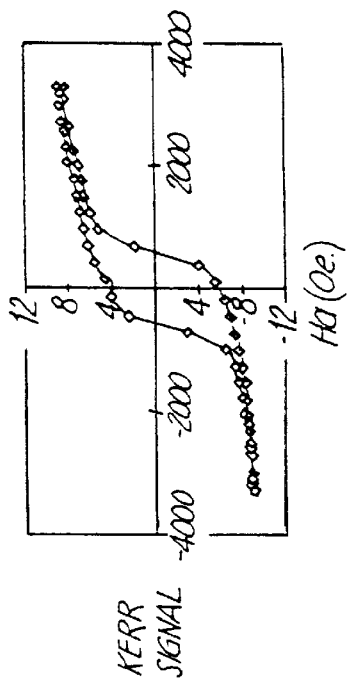
Figure 9A:
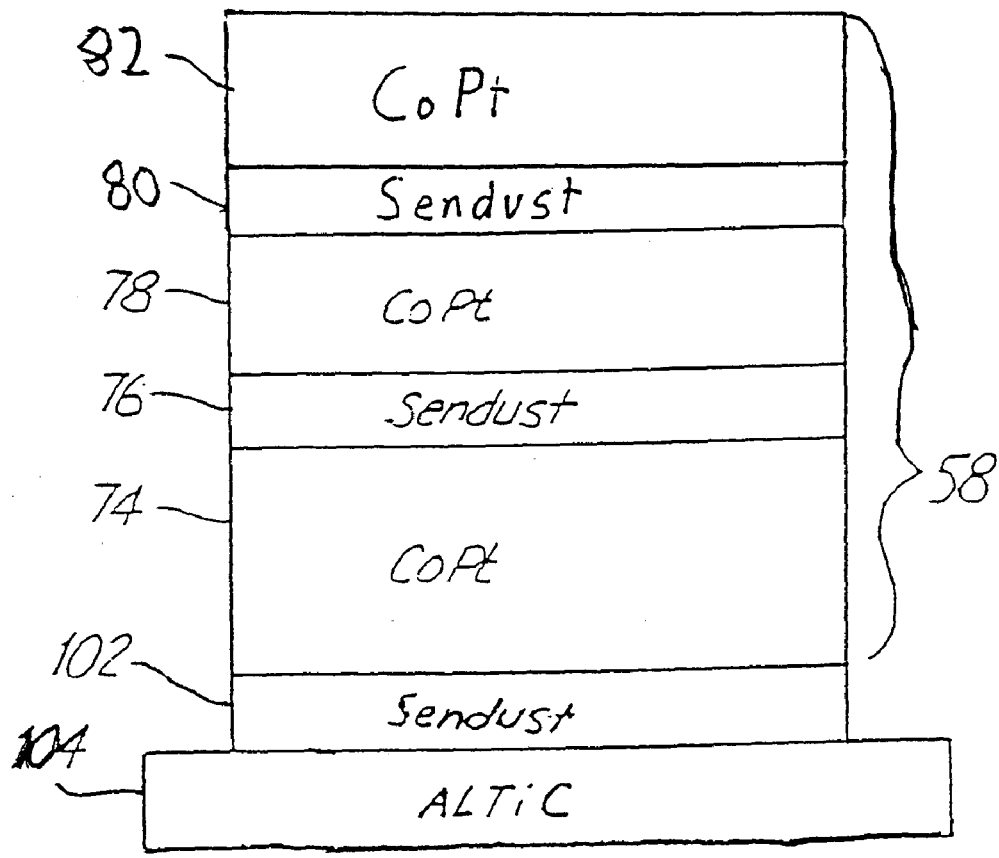
FIG. 9A is a hard magnet structure with more than two magnet layers.

The preferred hard magnet 58 of the present invention is shown in FIG. 9. For testing comparison purposes, it too was formed on a 100 Å thick underlayer 102 of nitrided sendust FeAlSi on a substrate AlTiC wafer 104. The first magnet layer 74 is a 800 Å thick layer of Cobalt-Platinum. The first intermediate seed layer 76 is a 100 Å thick layer of nitrided sendust FeAlSi, which has an amorphous structure, The second magnet layer 78 is a 400 Å thick layer of Cobalt-Platinum. Thus, the total thickness of hard magnet material is identical to the prior art hard magnet 100.

Figure 10:
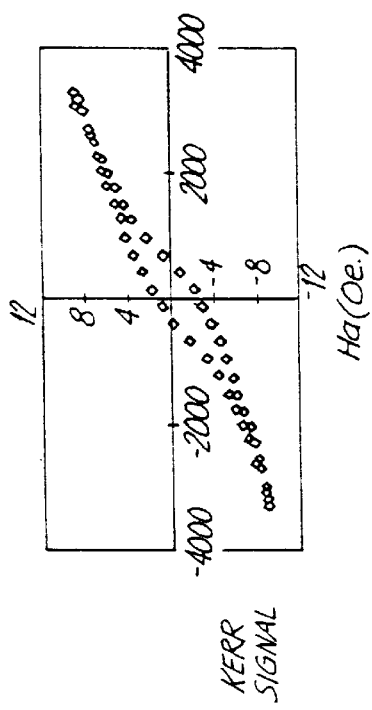
FIG. 10 is an alternative hard magnet structure and corresponding measured magnetization curve.
Figure 10:
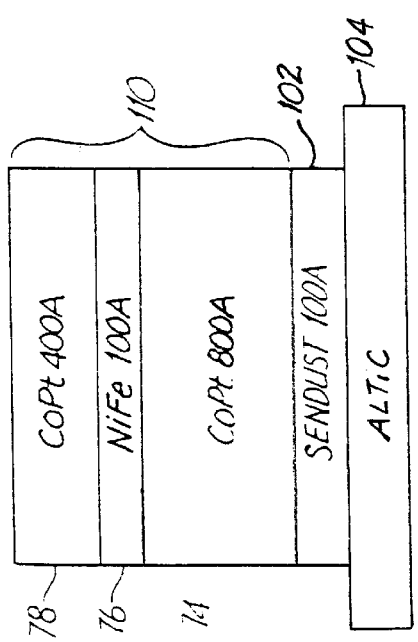

A first alternative hard magnet 110 is shown in FIG. 10. Similar to prior an hard magnet 100, hard magnet 110 was formed on a 100 Å thick underlayer 102 of nitrided sendust on a substrate AlTiC wafer 104. The first alternative hard magnet 110 is identical to the preferred hard magnets 58, 60, but the first intermediate seed layer 76 is formed of a 100 Å thick layer of Nickel-Iron rather than sendust.

Figure 11:
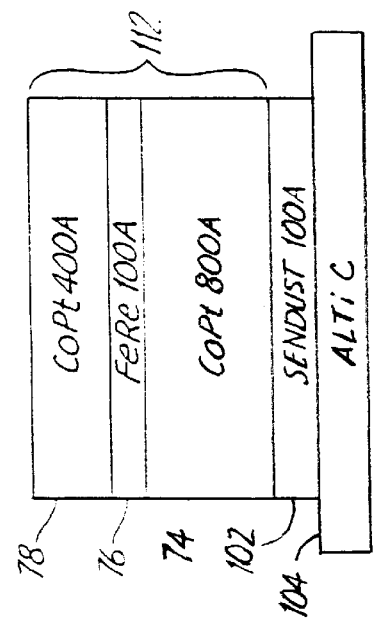
FIG. 11 is a second alternative hard magnet structure and corresponding measured magnetization curve.

A second alternative hard magnet 112 is shown in FIG. 11. Similar to the others, hard magnet 112 was formed on a 100 Å thick underlayer 102 of nitrided sendust on a substrate AlTiC wafer 104. The first alternative hard magnet is identical to the preferred hard magnets 58, 60, but the first intermediate seed layer 76 is formed of a 100 Å thick layer of Nickel-Iron-Rhenium rather than sendust.

Figure 12:
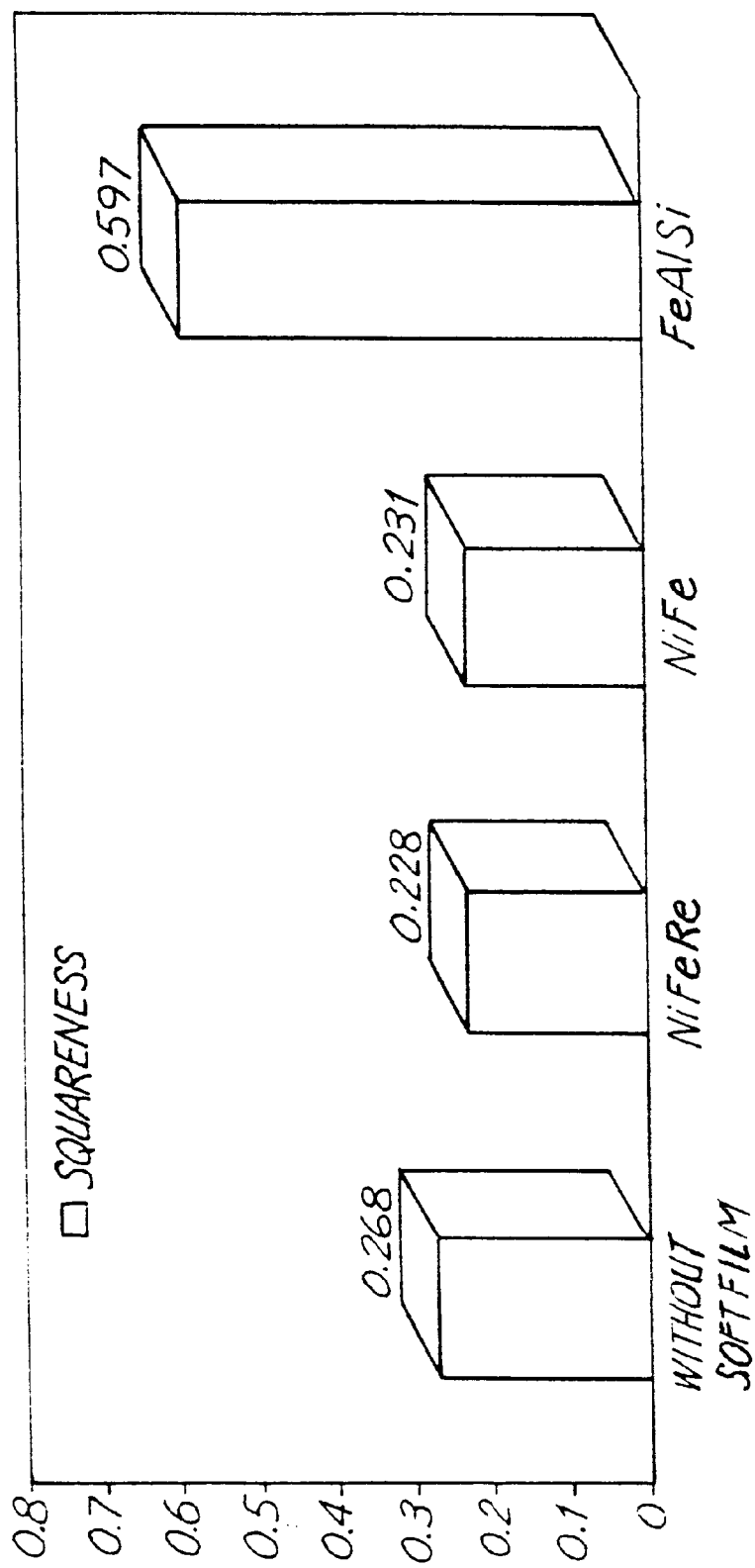
FIG. 12 is a chart of measured in plane squareness of the structures of FIGS. 8–11.
Figure 13:
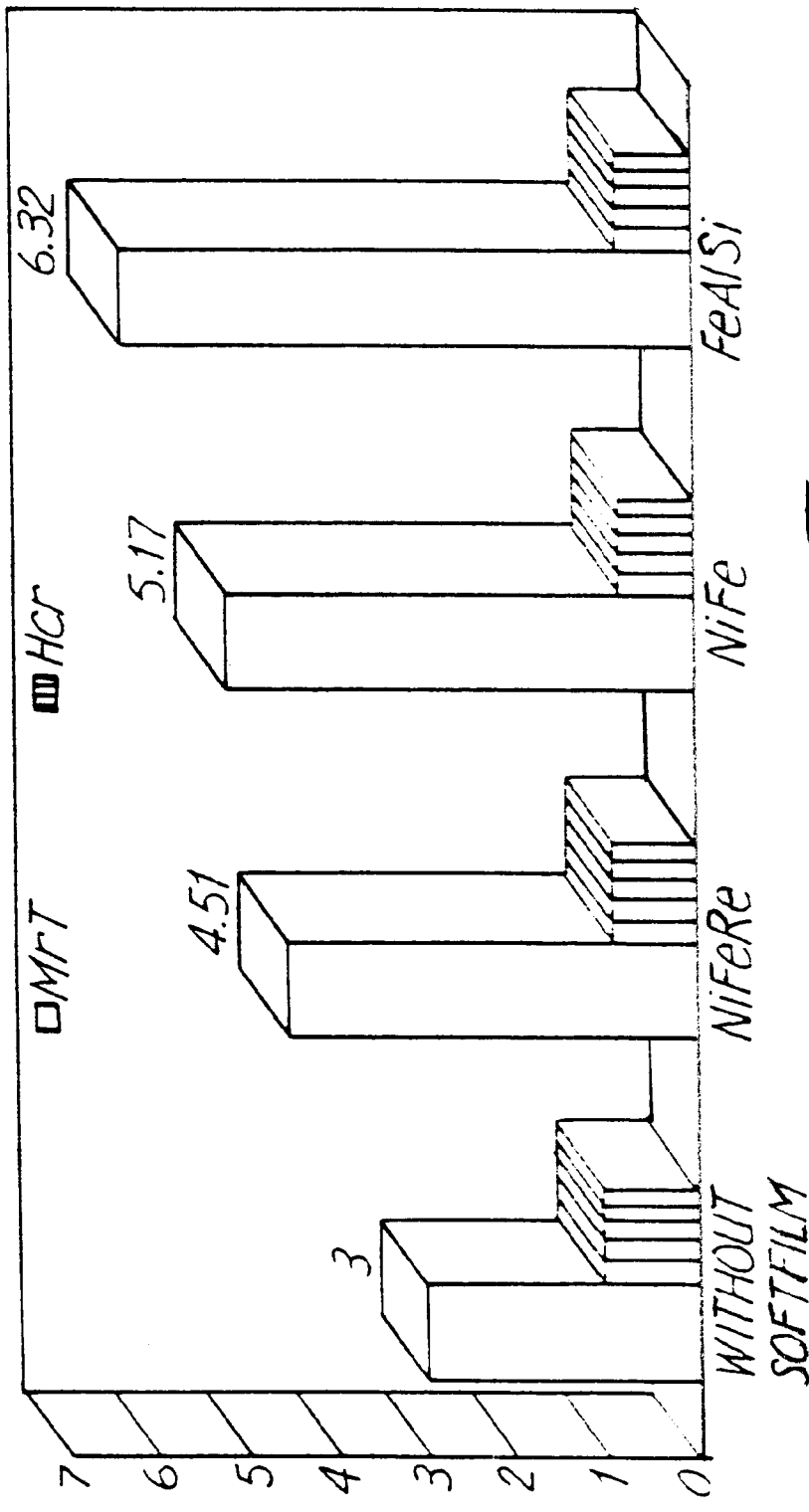
FIG. 13 is a chart of measured MrT and remanence coercivity of the structures of FIGS. 8–11.

The magnetization or hysteresis curve was determined for each of the hard magnets 58, 110, 112 by varying the length of the applied magnetic field and measuring the resultant magnetism of the test structure with a Magneto-Optic Kerr Effect Magnetometer (MOM). Each of the prior art hard magnet 100 and the hard magnets 58, 110, 112 were also tested with a remanent moment magnetometer and for electrical resistance of the entire sheets. The results of this testing is reported in FIGS. 12–14.

The magnetization curve of the preferred hard magnet 58 is clearly superior, showing both a significantly improved squareness and a significantly improved MrT as compared to the prior art hard magnet 100. In electrical sheet resistance and in remanence coercivity, the hard magnets 58, 110 and 112 are roughly equivalent to the prior art hard magnet 100. The Nickel-Iron intermediate seed layer of hard magnet 112 and the Nickel-Iron-Rhenium intermediate seed layer of hard magnet 114 did not improve squareness as compared to the prior art hard magnet 100, and this failure to improve squareness is believed to be due to the defined crystal structure of Nickel-Iron and Nickel-Iron-Rhenium. Hard magnets 112 and 114 do show considerable improvement in MrT over prior art hard magnet 100.

Although the present invention has been described with reference to preferred embodiments, workers skilled in the art will recognize that changes may be made in form and detail without departing from the spirit and scope of the invention. For instance, the laminated hard magnet structure of the present invention provides additional flexibility in the design of the MR sensor, and may be employed in new MR structures which have not previously been feasible. MR sensors having giant MR elements or anisotropic MR elements may be effective using the laminated hard magnets structure of the present invention. MR sensors used in tape heads usually need relatively thick longitudinal hard films, and the laminated hard magnet structure of the present invention will be more effective.

What is claimed is:

1. A magneto-resistive sensor comprising:
   a magneto-resistive element having an active area with an electrical resistance sensitive to changes in magnetic flux; and
   means for magnetically biasing the magneto-resistive element across the active area, wherein the means for magnetically biasing comprises a laminated structure of at least three magnetic, electrically conductive layers which are in direct contact over one another.

2. The magneto-resistive sensor of claim 1 further comprising:
   conductive leads for directing electric current through the active area of the magneto-resistive element.

3. The magneto-resistive sensor of claim 1, further comprising:
   a soft adjacent layer deposited adjacent a longitudinally extending side of the active area of the magneto-resistive element.

4. A magneto-resistive sensor comprising:
   a magneto-resistive element having an active area with an electrical resistance sensitive to changes in magnetic flux; and
   means for magnetically biasing the magneto-resistive element across the active area, wherein the means for magnetically biasing comprises:
   a first seed layer of soft magnetic, electrically conductive material;
   a first magnet layer of hard magnetic, electrically conductive material laminated to a longitudinally extending side of the first seed layer; and
   a second magnet layer of hard magnetic, electrically conductive material laminated against an opposing longitudinally extending side of the first seed layer and magnetically oriented in the same direction as the first magnet layer such that the first magnet layer, the first seed layer and the second magnet layer exhibit unified magnetic properties.

5. The magneto-resistive sensor of claim 4, wherein the soft magnetic, electrically conductive material is selected from the group consisting of: Cobalt-Zirconium-Hafnium, Cobalt-Zirconium-Niobium, and Cobalt-Zirconium-Tantalum, and Iron-Aluminum-Silicon; and wherein the hard magnetic, electrically conductive material is a Cobalt-based alloy.

6. The magneto-resistive sensor of claim 4, wherein the means for magnetically biasing further comprises:
   a second seed layer of soft magnetic, electrically conductive material laminated against an opposing longitudinally extending side of the second magnet layer.

7. The magneto-resistive sensor of claim 6, wherein the means for magnetically biasing further comprises:
   a third magnet layer of hard magnetic, electrically conductive material laminated against an opposing longitudinally extending side of the second seed layer and magnetically oriented in the same direction as the first magnet layer and the second magnet layer such that the first magnet layer, the first seed layer, the second magnet layer, the second seed layer and the third magnet layer exhibit unified magnetic properties.

8. The magneto-resistive sensor of claim 4, wherein the first seed layer has a thickness of from about 50 to 300 Angstroms, and the first magnet layer has a thickness of from about 300 to 800 Angstroms.

9. A magneto-resistive sensor comprising:
   a pair of longitudinally spaced biasing magnets for longitudinally biasing a magneto-resistive element having an active area with an electrical resistance sensitive to changes in magnetic flux; and
   means for increasing the thickness of the pair of longitudinally spaced biasing magnets, wherein the means for increasing the thickness comprises an intermediate layer of soft magnetic, electrically conductive material intermediate within each of the longitudinally spaced biasing magnets.

10. The magneto-resistive sensor of claim 9 wherein the means for increasing the thickness increases the thickness of the pair of longitudinally spaced biasing magnets to an overall thickness of more than about 1000 Angstroms.

11. The magneto-resistive sensor of claim 9 further comprising:
    conductive leads for directing electric current through the active area of the magneto-resistive element.

12. The magneto-resistive sensor of claim 11, wherein each biasing magnet is positioned between one of the conductive leads and the magneto-resistive element.

13. The magneto-resistive sensor of claim 9, wherein the soft magnetic, electrically conductive material has an amorphous crystalline structure.

14. The magneto-resistive sensor of claim 13, wherein the soft magnetic, electrically conductive material is selected from the group consisting of: Cobalt-Zirconium-Hafnium, Cobalt-Zirconium-Niobium, and Cobalt-Zirconium-Tantalum, and Iron-Aluminum-Silicon.

* * * * *

UNITED STATES PATENT AND TRADEMARK OFFICE
CERTIFICATE OF CORRECTION

PATENT NO. : 6,351,357 B1
DATED : February 26, 2002
INVENTOR(S) : Song Sheng Xue et al.

It is certified that error appears in the above-identified patent and that said Letters Patent is hereby corrected as shown below:

Drawings,
Insert the attached Fig. 9A with the figures 1-14.

Column 1,
Line 12, delete "or", insert -- of --
Line 32, delete "resistant", insert -- resistance --
Line 39, delete "he", insert -- the --
Line 41, delete "vanes", insert -- varies --

Column 4,
Line 37, delete "her", insert -- herein --

Column 5,
Line 37, delete "bard", insert -- hard --
Line 46, delete "r", insert -- hard --

Column 6,
Line 6, delete "Her", insert -- Hcr --

Column 7,
Line 30, delete "vanes", insert -- varies --

Column 8,
Line 5, delete "maybe", insert -- may be --
Line 52, delete "an", insert -- art --
Line 66, delete "length", insert -- strength --

Signed and Sealed this

Seventeenth Day of September, 2002

*Attest:*

*Attesting Officer*

JAMES E. ROGAN
*Director of the United States Patent and Trademark Office*